United States Patent [19]

Ledniczki et al.

[11] 4,288,786
[45] Sep. 8, 1981

[54] TOUCH SENSING KEYBOARD CONSTRUCTION

[75] Inventors: Ferenc Ledniczki, Foster City; Richard J. Patak, San Jose, both of Calif.

[73] Assignee: Touch Activated Switch Arrays, Inc., Santa Clara, Calif.

[21] Appl. No.: 3,708

[22] Filed: Jan. 15, 1979

[51] Int. Cl.³ .............................................. G06F 3/02
[52] U.S. Cl. .............................. 340/365 S; 328/142; 340/365 C
[58] Field of Search ............ 340/365 S, 365 C, 365 R; 178/17 A, 17 C; 179/90 K; 200/DIG. 1; 328/142; 307/115, 116; 178/79; 84/1.01

[56] References Cited

U.S. PATENT DOCUMENTS

| | | | |
|---|---|---|---|
| 2,647,689 | 8/1953 | Bowyer et al. | 340/365 S |
| 2,657,856 | 11/1953 | Edwards | 340/365 S |
| 3,065,298 | 11/1962 | Saykay | 340/365 S |
| 3,641,410 | 2/1972 | Vogelsberg | 340/365 C |
| 3,750,113 | 7/1953 | Cencel | 340/365 S |
| 4,088,994 | 5/1978 | McNay | 340/365 S |

OTHER PUBLICATIONS

"Non-Mechanical Keyboard", Goddard, IBM Tech. Disc., vol. 3, No. 11, Apr. 1961, p. 31.

Primary Examiner—James J. Groody

[57] ABSTRACT

The keys of a keyboard when operated serve as information entry elements by providing an associated output signal related thereto. A first series of conductors is operatively coupled to the keys for electrically sensing operation of the keys. A series of pairs of conductors common to the first series of conductors is arranged to represent binary stages of information. A signal representative of the operation of each one of the first series of conductors is coupled to one or the other conductor of each of the pairs of conductors to represent a first or second state thereof. These states are employed to provide a binary output representation for each of the keys when so operated.

2 Claims, 8 Drawing Figures

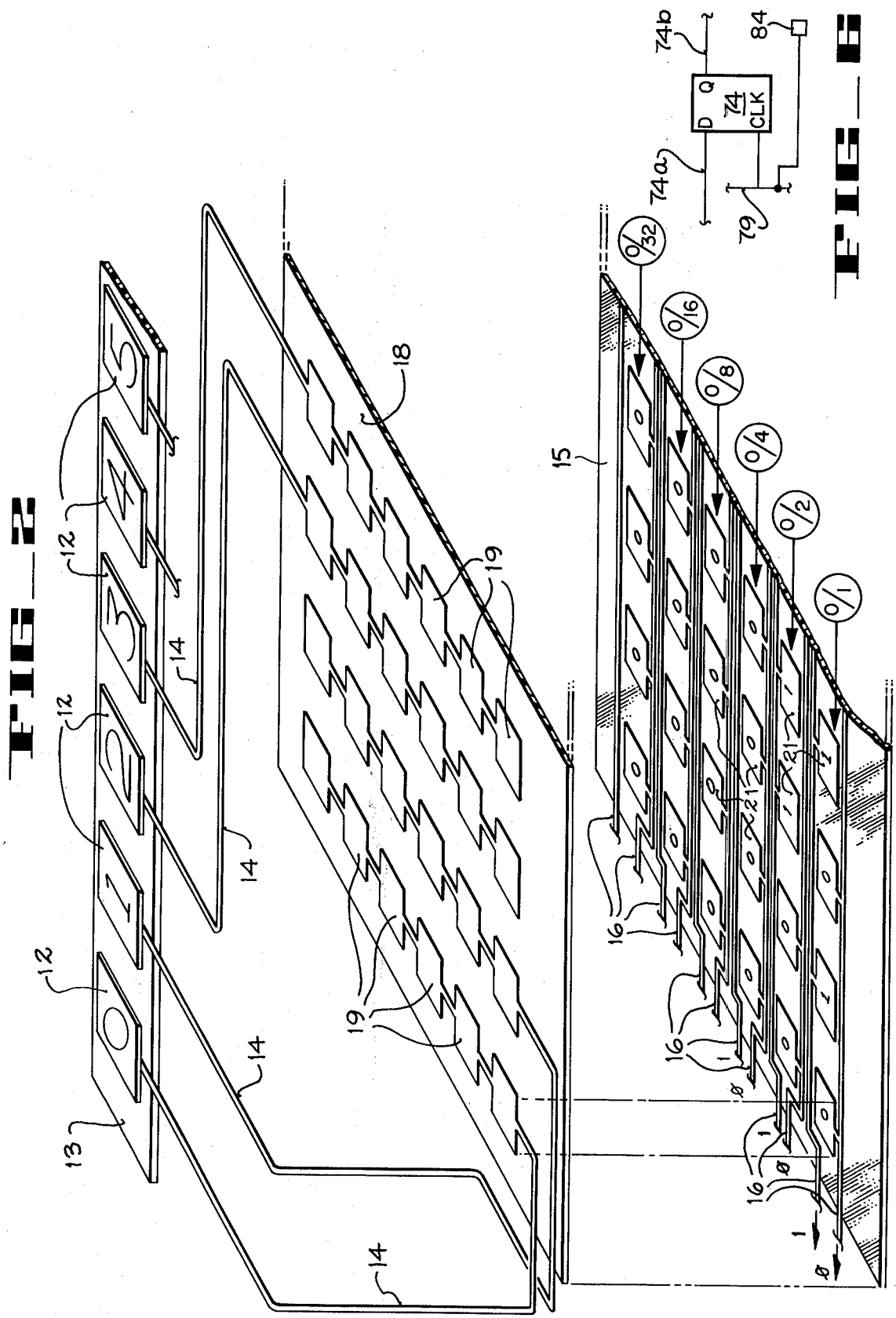

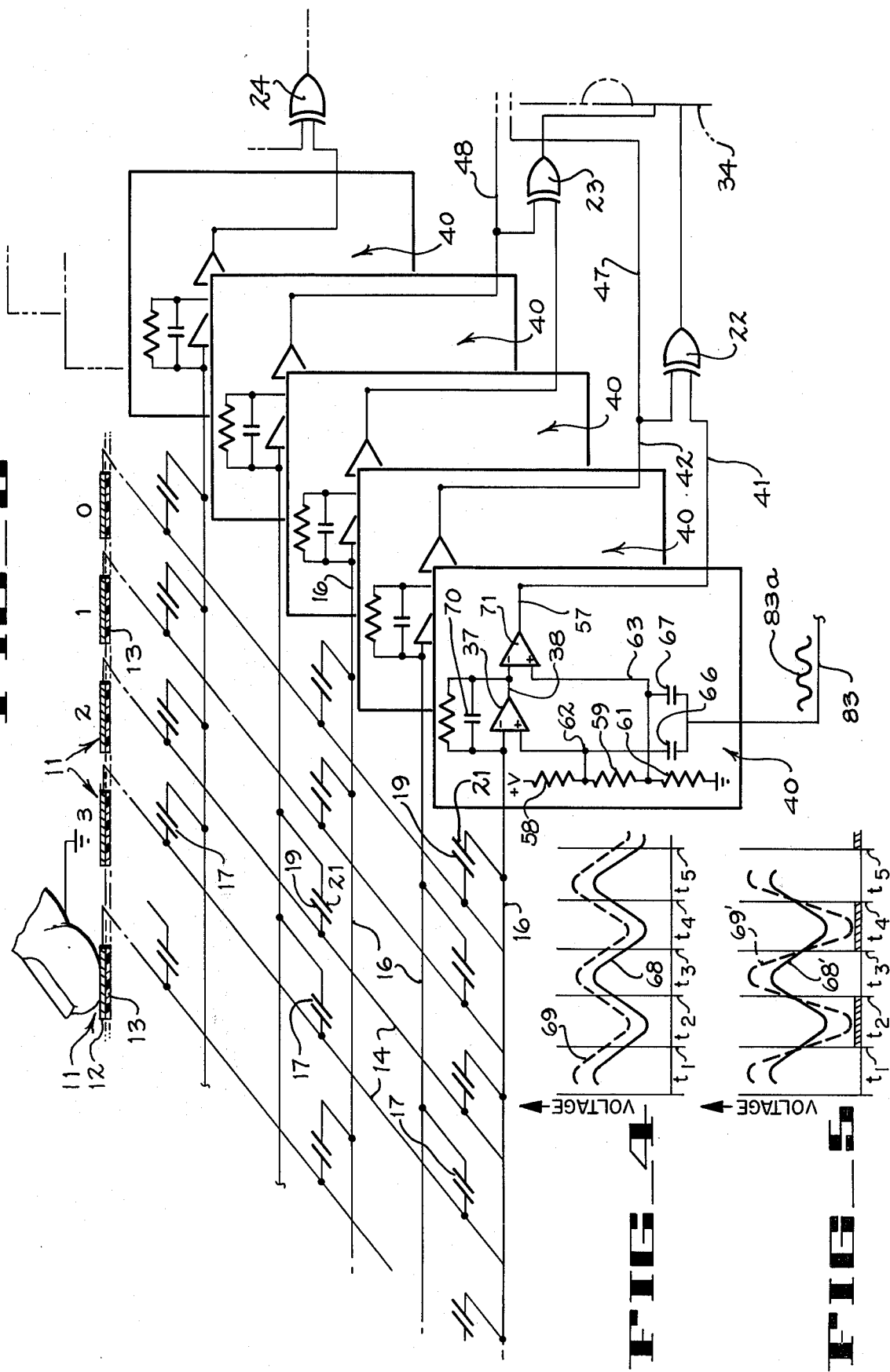

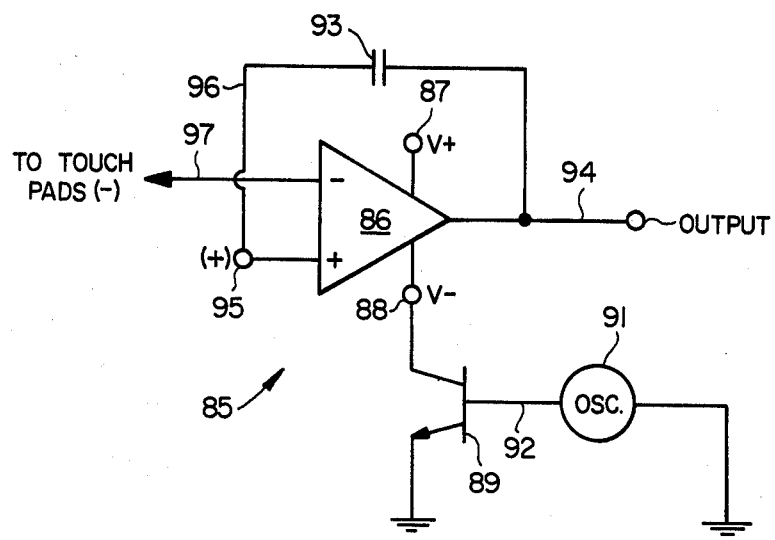
FIG_7
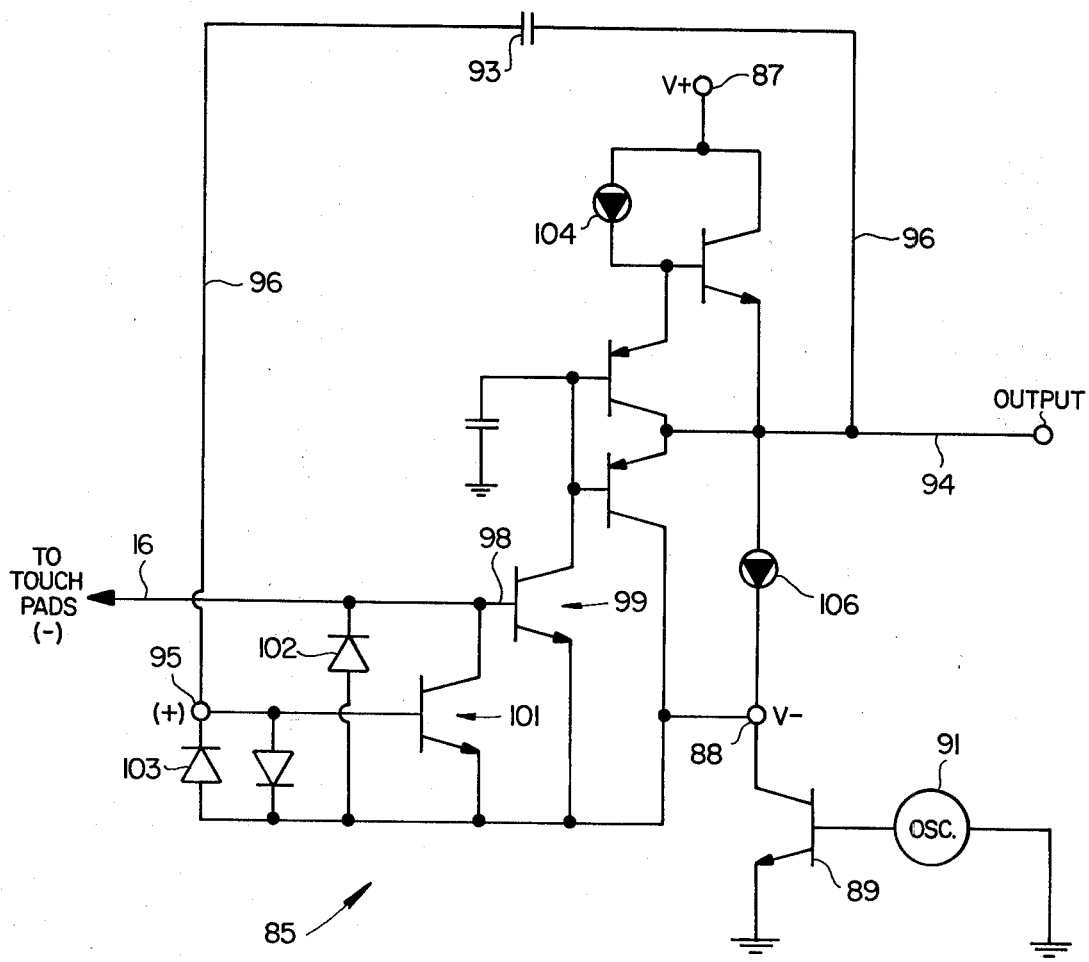
FIG_8

TOUCH SENSING KEYBOARD CONSTRUCTION

BACKGROUND OF THE INVENTION

This invention pertains to a keyboard construction and more particularly to a keyboard construction characterized by means for electrically encoding a response to the operation of each key.

It has been observed that heretofore keyboards have typically either used individual finger sensitive devices at each key position or have relied on complex mechanical linkages to connect each key to a few sensitive devices for the purpose of encoding the key activation. In general, the requisite sensitive devices are relatively expensive and have proven somewhat unreliable.

SUMMARY OF THE INVENTION AND OBJECTS

In general a keyboard construction is provided comprising a predetermined number of information entry elements adapted to be operated to provide entry information in accordance with a first numbering system. Data input lines are arranged in accordance with the first numbering system for carrying the entry information in response to operation of the information entry elements. Sensing lines are coupled to the data input lines in accordance with a second numbering system. Sensing means coupled to the sensing lines serve to detect signals thereon derived from operation of an element. Finally, means responsive to the sensed signals serves to encode the entry information into data representative of the entry information.

It is a general object of the present invention to provide an improved information entry keyboard.

It is a more particular object of the present invention to provide such an information entry keyboard involving no moving parts.

It is a further object of the invention to provide a keyboard construction of the kind described in a manner inherently reducing costs by employing fewer input circuits than keys.

It is yet a further object of the present invention to provide a keyboard construction having means for safeguarding against the improper activation of the keyboard, as by striking two keys simultaneously for example.

The foregoing and other objects of the invention will become more readily evident from the following detailed description of a preferred embodiment when considered in conjunction with the drawings.

BRIEF DESCRIPTION OF THE DRAWINGS

FIG. 2 shows a diagrammatic exploded view in perspective of a portion of the keyboard construction, according to the invention;

FIG. 3 shows a diagrammatic exploded view in perspective of that portion of the system shown in FIG. 1 embraced by the line 3—3, according to the invention;

FIGS. 4 and 5 show diagrammatic graphs employed in the explanation of the functioning of a circuit of a type shown in FIG. 3;

FIG. 6 shows a "D" type flip-flop for explanation.

FIG. 7 shows a schematic view of an amplifier sensor; and

FIG. 8 shows a detailed construction of the amplifier sensor of FIG. 7.

DETAILED DESCRIPTION OF A PREFERRED EMBODIMENT

Figure 1:
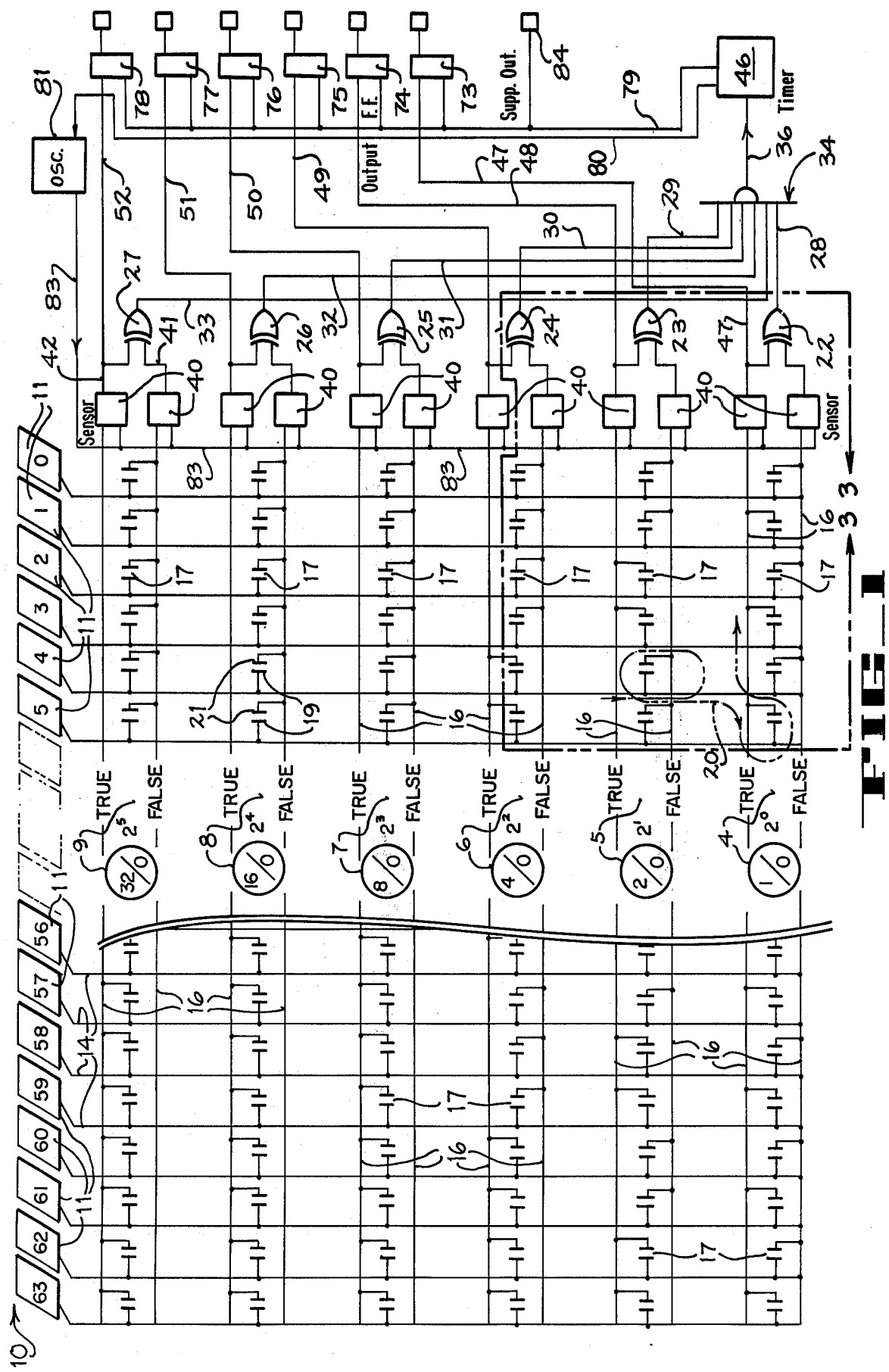
FIG. 1 shows a diagrammatic system view of a keyboard construction, according to the invention.

As shown, a keyboard construction 10 comprises an array of keys 11 forming information entry elements. Each key 11 comprises a discrete conductive pad element 12 (FIG. 3) carried upon the surface of a suitable insulating support medium 13. Each conductive element 12 has a sufficient surface area so as to be of convenient size to be readily touched with a finger by an operator using the keyboard. While a size of approximately ¾ inch square is believed optimum for present purposes other sizes for other applications may be desirable.

Conductive elements 12 are each connected by means of a conductive path 14 arranged in accordance with a first numbering system. Accordingly, for purposes of illustration it is to be noted that each of keys 11 carries indicia thereon indicative of the decimal information associated with each conductive path 14. In other circumstances keys 11 will carry other indicia such as alpha-numeric information as on the keyboard of a typewriter, teletypewriter, etc. Accordingly, it is readily evident that even though keys 11 may carry other data thereon the conductive paths 14 are arranged in accordance with a given numbering system.

As disclosed herein sixty-four paths 14 are provided, identified for convenience by their associated keys bearing numbers 0-63. When a person's finger touches each pad 12 the person's body applies capacitance to ground which can be sensed via conductor 14. As thus arranged paths 14 form data input conductors.

As explained more fully below a series of pairs of conductors 16 are disposed in common to the first series of conductors 14. Means for coupling a signal representative of the operation (touching) of each one of the first series of conductors 14 to one or the other conductor of each of the pairs of conductors 16 serves to represent a first or second state of the coupling means associated with each pair of conductors. Accordingly, as diagrammatically represented in FIG. 1 and more fully explained further below with respect to FIG. 2, a fixed predetermined arrangement of capacitive coupling between conductors 14 and 16 is provided. As an example, if key 11 representing the numeral 3 is touched by a person's finger, the associated conductor 14 will attain capacitance to ground which will be sensed via conductors 16 due to the connection between conductors 16 and 14 via capacitor 17.

The pairs of conductors 16 are arranged in binary stages representing information 1, 2, 4, 8, 16 and 32 respectively. In order to provide an appropriately binary coded output each pair of conductors is arranged whereby one or the other conductor 16 is capacitively coupled to each sensing conductor. When coupled to the bottom conductor of the pair a first binary state is established representative of a binary "0." When coupled to the other conductor of the pair a second binary state is established representing a binary "1."

Accordingly, by touching the key representing #3 it is to be noted that the capacitive coupling between conductors 14 and 16 for the first and second stages (pairs of conductors 16) is a "true" connection producing binary output signals representative of decimal 3. Accordingly, the pairs of conductors 16 are arranged to represent binary stages of information or a second numbering system.

As thus arranged conductors 14 can be considered to be data input lines and conductors 16 can be considered to be sensing lines.

Means forming the capacitive coupling 17 shown in FIG. 1 is best shown with respect to the keyboard construction in FIG. 2. The top surface of a broad thin dielectric substrate 18 carries the top plates 19 of capacitors 17. These top plates 19 are disposed in close proximity with associated bottom plates 21 carried on the opposite face of substrate 18. A thick protective backing layer 15 of insulating material can be laid behind plates 21.

The foregoing construction can be accomplished by known means such as by using printed circuit techniques and the like.

From the foregoing it should be readily evident that by touching one of the conductive pad elements 12 all associated top plates 19 will attain capacity to ground so as to vary the capacitive coupling with respect to their associated bottom plates 21. Accordingly, bottom plates 21 are coupled in coded fashion according to a second numbering system to sensing lines 16 so that information according to the first numbering system can be sensed in accordance with a second numbering system as now to be described.

Touch sensitive circuits 40 coupled to each of sensing lines 16 generate a six bit binary code from Exclusive OR gates 22–27 for the 64 key array shown herein. Circuits 40 serve to detect the presence or absence of a signal on an associated sensing line 16. From inspection of FIG. 1 it is to be noted that each key 11 is directly connected by way of a conductor 14 to the top plates 19 of six capacitors 17 which provide capacitive coupling to six touch sensitive circuits 40. There are, however, several false paths available (as illustrated by phantom line 20 in FIG. 1) whereby capacity is "apparently" connected to the input of circuits 40 which are not directly connected to keys 11. Circuits 40 are provided with a low impedance input to inhibit the formation of such "apparent connections." The low impedance input in circuits 40 is obtained by employing operational amplifiers so that the input resists any attempt to change voltage as noted above. In general, whenever a touch sensitive circuit 40 is energized there is a current which flows into and out of the input terminal. This current attempts to change the voltage at the input terminal from the value it naturally seeks. Any forced voltage change at this terminal will affect input terminals of other touch sensitive circuits 40 due to the false paths mentioned above. Low impedance inputs have the characteristic that they will resist any change in voltage due to external causes. Hence this has the effect of shorting out the false paths such that only the touch sensitive circuitry directly connected to the keys via the capacitive coupling become energized.

Whenever a single key is touched, a unique combination of touch sensitive circuits 40 will be activated according to the binary stages which are coupled to the key. Only the numeral "1" or the numeral "0" of each binary bit of the stages 4–9 will be activated. Never will both bits of any given stage be activated at the same time. Thus, a "valid" activation (touching of a key 11) requires that (with respect to all six bits [stages 4–9]) only one or the other of the sensing lines 16 associated therewith be activated. This requirement provides a validity test.

Means for logically implementing such a test comprises exclusive OR circuits 22–27 arranged to give a "true" output if only a single input is "true." If neither is "true" or both are "true" then the output is "false." Thus, a valid binary coded signal from operation of a given key results in a "true" signal appearing at all the exclusive OR outputs, 28–33.

The touch activated circuitry associated with each sensing line 16 serves to provide a digital output of "1" or "0" with respect to the status of any associated sensing line a digital "1" indicates that a data entry line 14 has been capacitively coupled to the "true" sensing lines 16 whereas a "0" represents the absence of such coupling.

Inasmuch as each of the touch activated circuits 40 associated with sense lines 16 is the same, a description of a single circuit 40 is believed to be a sufficient description of the remaining circuits 40 herein.

Circuits 40, arranged in pairs, are each coupled to an associated one of a pair of lines 16. Each circuit 40 provides an output representative of binary "1" or "0."

Touching of the conductive element 12 of each key 11 adds capacitance to ground on an associated conductor 14 to provide a "1" on conductors 16 where capacitors 17 are coupled to the upper conductor 16 of any given pair. Thus, circuits 40 are arranged whereby in the absence of adding capacitance to ground on the input leads 16 thereof, the output lead 41 will be a "0."

With respect to circuits 40 it is evident that a voltage divider comprised of resistors 58, 59, 61 provides a first voltage level at point 62 which is higher than the voltage level provided on line 63. A signal of substantially 2 volts amplitude and substantially 20 khz frequency is impressed upon the voltage levels at point 62 and line 63 by means of an oscillating signal 83a via leads 83 from oscillator 81. This signal 83a appears on both lines 62 and 63 equally via the pair of capacitors 66, 67 connected in common to lead 83. The only difference between the signals on 62 and 63 is that the voltage at 63 is normally instantaneously slightly below that of the voltage at 62. This relationship is shown in the graph of FIG. 4 wherein a trace 68 represents the voltage on lead 63 which remains slightly below trace 69, the latter trace representing the voltage at point 62.

When no capacitance to ground has been coupled to a given sensing line 16 the resulting value of capacitance associated with such line 16 is zero or near zero. Under these conditions, the voltage at 38 from operational amplifier 37 will be at or nearly equal to the voltage at 62.

When sensing line 16 detects the additional capacitance to ground caused by touching a key 11 the input capacitance developed on line 16 takes a value of the order of 2 pf (pico farad) by supplying a capacitor 70 also of substantially 2 pf, the output of operational amplifier 37 becomes substantially greater. For example, as shown with regard to the graph in FIG. 5 it will be noted that when the amplitude of the output on lead 38 from operational amplifier 37 is larger (as occurs when the sensing lines 16 are active) the voltage of a portion of each cycle (indicated by the time between $t_1$ and $t_2$ and the time between $t_3$ and $t_4$) drops (along trace 69') below the voltage of trace 68'. During these times comparitor 71 indicates that voltage on trace 69' is less than the voltage on trace 68'. At this point its output on lead 57 changes from a digital "0" to a digital "1."

Means for providing validity checking of the activation of all stages of the keyboard construction in response to operation of a given key is employed in view of the fact that it has been observed that it is difficult, if not impossible, to cause all touch sensitive circuits 40 to have the same sensitivity. Accordingly, without validity checking it becomes possible to generate incorrect binary codes if a finger touch should activate some but not all of the required circuits 40. As described further below a binary output representing information corresponding to the information represented by the input keys 11 is provided only after valid signals are detected from all stages 4-9 in response to a key touch.

Accordingly, the outputs 28-33 respectively associated with Exclusive OR gates 22-27 are fed to a validity AND gate 34 in order to ensure valid activation at all states as noted above.

As noted in FIG. 1 the pairs of sensing conductors 16 are arranged whereby the upper conductor represents a "true" or digital "1" output whereas the lower sensing line 16 represents a "false" or digital "0" output. Accordingly, the output from the upper touch sensitive circuit for each pair of conductors 16 is, in each instance, representative of a binary "1" and these outputs appears on leads 47-52.

Accordingly, each sensing circuit 40 is coupled to one of conductors 16 for providing an output representation of the state thereof when the information entry elements 12 are operated. Means responsive to the sensing means serves to encode the information entered via keys 11 into data which is representative of the same information but arranged according to a different numbering system. As thus arranged a series of six "D" type flip-flops 73-78 are respectively coupled to data output leads 47-52.

As is known, in a "D" type flip-flop signals at the "D" input 74a will transfer to the "Q" output 74b in response to change in each pulse on clock line 79.

In order to guard against the possibility of one or more touch sensitive circuits 40 from being energized at or about its threshold of sensitivity so as to cause its response to become unsteady, circuitry is added as now to be described. Thus, a timing circuit 46 coupled to the output 36 from AND gate 34 requires the presence of a binary "1" on line 36 for a pre-determined period of time before a clock or data transfer pulse will be generated on clock line 79. Similarly, circuit 46 is arranged in known manner whereby the "1" output on line 79 will remain until a prolonged interruption of the input signal on line 36 for a preset period of time. Accordingly, timing circuit 46 will not produce an output pulse for clocking data through the "D" type flip-flops 73-78 unless the input on line 36 maintains a steady input. By the same token the clocking data via flip-flops 73-78 will remain uninterupted unless there is a prolonged (valid) interruption of the signal on line 36.

Accordingly, timing circuit 46 responds to steady valid or invalid signals, but will ignore short bursts of valid signals or short bursts of invalid signals which can result from random causes, for example.

It is readily evident that the same information that was entered into the keyboard via keys 11 is represented by the state of the outputs from flip-flops 73-78 but using a different numbering system.

Timing circuit 46 also supplies a signal via lead 80 which increases the amplitude of the output of oscillator 81 via lead 83 to drive touch sensitive circuits 40. This serves to make circuits 40 suddenly more sensitive to the touch than they were before the signal arrived from timing circuit 46. Thus, any circuits 40 which may have been energized at their sensitivity threshold will become positively energized, eliminating any possible unsteady output. Also, if by any chance an invalid signal appears at the validity AND gate 34 (as can occur if more than one key is accidently touched) the response will be immediately recognized as an invalid response whereby no further operation will take place due to the presence of exclusive OR gates 22-27.

If, however, the output of validity AND gate 34 remains "true" after the sensitivity of circuits 40 has been increased, a valid key touch will be considered to have been recognized and a signal will then be generated by timing circuit 46 which is connected to the "clock" inputs of flip-flops 73-78.

In addition to transferring the data from the "D" input 74a to the "Q" output 74b in each of flip-flops 73-78 the signal on line 79 also appears at the supplemental output pin 84 so as to enable external devices to know that a new valid key has been energized. Having this additional information can be useful, for example, when identical information is repeated, e.g. "222." Otherwise it may appear that only a single piece of information has been transmitted. For example, when a sequence of ones is desired to be transmitted it may otherwise be difficult to determine whether or not only a single "one" has been transmitted rather slowly or a sequence of "ones" has been transmitted.

From the foregoing it is readily evident that there has been provided an improved keyboard construction of a type responsive to the touch of a person's finger while having no moving parts whatever. Accordingly, by eliminating moving parts the keyboard construction is characterized by enhanced reliability and reduced cost of construction and maintenance.

With respect to the operation of touch activated or touch sensitive circuits 40, it is to be observed that the measure of performance of such circuits, when connected in the manner previously described, is related to the input impedance of the device. As the input impedance is reduced, more and more "false paths" 20 as previously described develop.

According to another embodiment of circuit 40, a touch sensitive circuit having a greater input impedance than that of the previous embodiment is disclosed which is quite capable of operating a 64 key keyboard. In addition, the embodiment as now to be described is considered to be easier to build and less expensive since it employs commonly available parts, such as the Norton amplifiers noted above.

In general, as shown in FIG. 7, a touch sensitive circuit 85 comprises a so-called Norton amplifier 86 having a positive power supply terminal 87 and a negative power supply terminal 88.

It has been observed that when the Norton amplifier 86 is controlled by means as described further below an improved touch sensitive circuit 85 can result.

Accordingly, a transistor switch 89 is coupled between ground and the V(−) terminal 88 while an oscillator 91 applies a varying signal to the base electrode 92. In addition to the above, a small capacitor 93 in a feedback loop 96 from the output terminal 94 to the positive input 96. The negative input lead 16 is connected to base element 98.

While a so-called "Norton" type amplifier employs an input impedance which is much greater than that of the touch sensitive circuit 40 described above whereby it would not be expected to be used per se as a touch sensitive circuit, it has been observed that by coupling a Norton amplifier in the manner described immediately above and operating same with switching means 89, oscillator 91 and the like as described causes the circuit 85 to become quite sensitive and highly useful with respect to detecting the touching of pads 11.

The input via lead 16 into the base electrode 98 of transistor 99 exhibits normal transistor action. The input resists any attempt to change voltage, regardless of current flowing into or out of lead 16. It therefore acts as a low impedance input terminal. This impedance would normally be considerably higher than the impedance at the input terminal of an operational amplifier connected as previously described. However, when used in a configuration having a limited number of false paths, the circuit performs satisfactorily. Transistor 101 is connected in a "current mirror" configuration wherein current into or out of a given terminal (inverting input) acts in an equal but opposite way to current flowing into or out of the other terminal (non-inverting input). In this way a general purpose amplifier is provided with essentially equal inverting and non-inverting inputs. Current flowing into the inverting input 16 will cause the output terminal 94 to go negative. When both inputs are unconnected, the output terminal 94 will remain in a fully positive state.

By connecting the positive power supply terminal 87 to a voltage of approximately ten volts, and the negative power supply terminal V(−) 88 through a transistor switch 89 to ground as shown in FIGS. 7 and 8, the emitters of the two transistors 99, 101 will be connected to ground potential when transistor switch 89 is on. Because of the base-emitter junctions of transistors 99, 101 both of their base elements will also appear at approximately ground potential.

When transistor switch 89 is "off," terminal 88 and both emitters of the input transistors 99, 101 will go positive until they reach a voltage substantially approximate that which is connected to terminal 87. Diodes 102, 103 serve to cause the base electrode of both transistors 99, 101 to be pulled positive.

By alternately turning transistor switch 89 on and off, as by means of oscillator 91, terminal 88 and the input terminals 16, 95 will have a square wave form applied on each of them as will the base elements of transistors 99, 101.

If the inverting input 16 of the Norton type amplifier 86 is connected to one of the touch pads 11 by a capacitor 17, the following will occur.

When switch 89 closes, both emitters of transistors 99, 101 go negative. This, in turn, causes both base elements to go negative as well. The base element 98 of the inverting input will, however because of its capacity to ground, (caused by the touching of a finger to pad 11) have current flow into base element 98. This current will then be sensed by amplifier 86 and result in output terminal 94 going negative during the period of time that transistor switch 89 is closed. In the absence of sensing a touch on input 16, the output at 94 will remain continuously positive.

It has been observed that if a small capacitor 93 of about 2 pf is connected between the output terminal 94 and the non-inverting input terminal 95 to form a feed-back loop, there develops a non-linear gain condition for the amplifier circuit to cause the amplifier sensitivity to suddenly increase in response to touching a pad 11. Thus, a highly advantageous non-linear condition occurs causing the sensitivity of amplifier 86 to suddenly increase whenever the touch of a pad 11 is sensed by the circuit.

Thus, as in the system shown in FIG. 1 wherein circuit 46 serves to increase the amplitude of signals from oscillator 81 whereby to cause circuits 40 to become more sensitive at a given time, i.e. after detecting a "valid" touch via a signal on line 36, the embodiment shown in FIGS. 7 and 8 will be continuously highly sensitive even though the input impedance may be greater than in circuits 40.

Elements 104, 106 represent current generating devices of a type characterized by providing and sustaining constant output current notwithstanding variations of voltage applied thereto.

We claim:

1. A keyboard construction comprising a predetermined number of keys disposed in an array for operation therein, said keys when operated serving to provide an associated output signal related thereto, encoding means comprising a first series of conductors operatively coupled to said keys for electrically sensing operation of said keys, a series of pairs of conductors common to said first series of conductors, each of said pairs representing a binary number, means for coupling a signal representative of the operation of each one of said first series of conductors to one or the other conductor of each of said pairs of conductors to represent a first or second state thereof, and means coupled to said pairs of conductors for providing a binary output representation for each of said keys when so operated, means disposed downstream of said encoding means for detecting the operation of each key, and validity checking means responsive to the detection of the operation of said keys and serving to preclude an output from the system upon finding an invalid condition in the operation of said keys, said validity checking means being disposed downstream of said encoding means.

2. A keyboard construction comprising means defining a predetermined number of information entry elements adapted to be operated when touched to provide entry of information in accordance with a first numbering system, data input lines arranged in accordance with said first numbering system for carrying said entry information, sensing lines coupled to said data input lines in accordance with a second numbering system, sensing means coupled to said sensing lines for detecting signals thereon, and means responsive to said sensed signals for encoding the entry information into data representative of said entry information, said sensing means including a Norton amplifier circuit associated with each sensing line, said circuit having inverted and non-inverted input leads, said inverted inputs being adapted to receive a capacitance to ground signal in response to touching an associated information entry element and provide an enhanced output signal in response thereto, a feed-back loop coupled between the output of said amplifier and said non-inverted input thereto, said feed-back loop including a capacitor serving to develop a non-linear gain condition for said amplifier circuit to cause the sensitivity of said amplifier to suddenly increase in response to touching of the last named information entry element, said circuit being operatively coupled between a positive voltage terminal and a negative voltage terminal, and alternating means for repeatedly switching said negative voltage terminal to ground to increase the sensitivity of said amplifier.

* * * * *

UNITED STATES PATENT AND TRADEMARK OFFICE
CERTIFICATE OF CORRECTION

PATENT NO. : 4,288,786

DATED : September 8, 1981

INVENTOR(S) : FERENC LEDNICZKI and RICHARD J. PATAK

It is certified that error appears in the above-identified patent and that said Letters Patent are hereby corrected as shown below:

Claim 1 is rewritten as: --

1. A keyboard construction comprising a first array of columns and rows of laterally spaced capacitor plates lying in a common plane, a second array of capacitor plates aligned in closely spaced confronting relation with respect to said plates of said first array, a thin dielectric layer interposed between the confronting plates to form capacitor elements therebetween, said capacitor elements forming keys for entry of information into said keyboard in accordance with a first numbering system, a column of capacitors associated with each said key, each of a first series of conductors being coupled between one of said keys and an associated one of a column of capacitors, a second series of conductors responsive to the last named capacitors and coupled in common to each of said first series of conductors in accordance with a second numbering system, sensing means coupled to said second series of conductors for detecting signals thereon in response to operation of said keys, and

UNITED STATES PATENT AND TRADEMARK OFFICE
CERTIFICATE OF CORRECTION

PATENT NO. : 4,288,786
DATED : September 8, 1981
INVENTOR(S) : FERENC LEDNICZKI and RICHARD J. PATAK It is certified that error appears in the above-identified patent and that said Letters Patent are hereby corrected as shown below:

means responsive to said signals for encoding said information into data representative thereof. --

Signed and Sealed this

Fourteenth Day of September 1982

[SEAL]

Attest:

Attesting Officer

GERALD J. MOSSINGHOFF
Commissioner of Patents and Trademarks